United States Patent [19]
Witek et al.

[11] Patent Number: 6,146,970
[45] Date of Patent: Nov. 14, 2000

[54] CAPPED SHALLOW TRENCH ISOLATION AND METHOD OF FORMATION

[75] Inventors: Keith E. Witek, Austin; Mike Hsiao-Hui Chen, Pflugerville; Stephen Shiu-Kong Poon, Austin, all of Tex.

[73] Assignee: Motorola Inc., Schaumburg, Ill.

[21] Appl. No.: 09/084,280

[22] Filed: May 26, 1998

[51] Int. Cl.[7] .......................... H01L 21/76; H01L 21/331; H01L 21/336

[52] U.S. Cl. .......................... 438/424; 438/294; 438/295; 438/296; 438/318; 438/353; 438/355; 438/359

[58] Field of Search ..................... 438/296, 294, 438/295, 297, 318, 353, 355, 359, 435, 423, 424; 257/500, 510

[56] References Cited

U.S. PATENT DOCUMENTS

| | | | |
|---|---|---|---|
| 4,571,819 | 2/1986 | Rogers et al. | 29/576 |
| 4,599,136 | 7/1986 | Araps et al. | 156/643 |
| 4,630,343 | 12/1986 | Pierce et al. | 29/576 |
| 4,630,356 | 12/1986 | Christie et al. | 29/576 |
| 4,631,803 | 12/1986 | Hunter et al. | 29/576 |
| 4,656,497 | 4/1987 | Rogers et al. | 357/50 |
| 4,671,851 | 6/1987 | Beyer et al. | 156/645 |
| 4,671,970 | 6/1987 | Keiser et al. | 427/93 |
| 4,689,656 | 8/1987 | Silvestri et al. | 357/49 |
| 4,692,992 | 9/1987 | Hsu | 437/57 |
| 4,740,480 | 4/1988 | Ooka | 437/61 |
| 4,791,073 | 12/1988 | Nagy et al. | 437/67 |
| 4,824,797 | 4/1989 | Goth | 437/67 |
| 4,839,306 | 6/1989 | Wakamatsu | 437/67 |
| 4,847,214 | 7/1989 | Robb et al. | 437/67 |
| 4,980,306 | 12/1990 | Shimbo | 437/34 |
| 5,064,683 | 11/1991 | Poon et al. | 437/39 |
| 5,099,304 | 3/1992 | Takemura et al. | 357/49 |
| 5,190,889 | 3/1993 | Poon et al. | 437/67 |
| 5,387,540 | 2/1995 | Poon et al. | 437/67 |
| 5,811,347 | 9/1998 | Gardner et al. | 438/435 |
| 5,837,612 | 11/1998 | Ajuria et al. | 438/697 |
| 5,994,200 | 11/1999 | Kim | 438/425 |
| 6,020,230 | 2/2000 | Wu | 438/222 |
| 6,057,209 | 5/2000 | Gardner et al. | 438/427 |
| 6,057,210 | 5/2000 | Yang et al. | 438/427 |

FOREIGN PATENT DOCUMENTS

| | | | |
|---|---|---|---|
| 63-88866 | 4/1988 | Japan | H01L 29/78 |
| 2-54557 | 2/1990 | Japan | H01L 21/76 |

OTHER PUBLICATIONS

Furukawa, et al., Gate Oxide Integrity of Shallow–Trench–Isolation Tech, Abstract No. 289, Electrochemical Society, Extended Abstracts, vol. 90–2, pp. 415–416. No Date.

Lindenberger et al., "Submicron Mechanically Planarized Shallow Trench Isolation With Field Shield", IEEE 1991 VLSI Tech. Symp. Digest of Technical Papers, OISO, pp. 89–90. No Month.

B. Guiliaumot et al., "Flash EEPROM Cells using Shallow Trenen Isolator", 1996 IEEE Int'l. Non–Volatile Memory Tech. Conf., pp. 74–75.

Simon Deleonibus et al., Differential Body Effect Analysis and Optimization of the LArge Tilt Implanted Sloped Shallow Trench Isolation Process (LATI–STI), IEEE Jun. 1996 Proceedings Conf. on Non–Volatile Memory Technology Conf., Cat. No. 96th8200, pp. L971–L973.

*Primary Examiner*—Richard Booth
*Assistant Examiner*—Ha Tran Nguyen
*Attorney, Agent, or Firm*—Keith E. Witek

[57] ABSTRACT

A method for forming a capped shallow trench isolation (CaSTI) structure begin by etching a trench opening (210). The opening (210) is filled with an oxide or like trench fill material (216b) via a deposition and chemical mechanical polish (CMP) step. The plug (216b) is reactive ion etched (RIE) to recess a top of the plug (216b) into the trench opening (210) to form a recessed plug region (216c). A silicon nitride or oxynitride capping layer (218b) is then formed over the recessed plug region (216c) via another deposition and polishing step. The nitride cap layer (218b) protects the underlying region (216c) from erosion due to active area preparation, cleaning, and processing.

31 Claims, 9 Drawing Sheets

CAPPED SHALLOW TRENCH ISOLATION AND METHOD OF FORMATION

FIELD OF THE INVENTION

The present invention relates generally to semiconductor processing, and more particularly to, nitride capping shallow trench isolation (STI) regions to prevent trench fill erosion during active area processing.

BACKGROUND OF THE INVENTION

In the integrated circuit (IC) industry, trench isolation, especially shallow trench isolation (STI), is now being used to replace conventional local oxidation of silicon (LOCOS). Shallow trench isolation is preferred since STI forms improved field isolation structures what have reduced bird's beak active area encroachment, improved device-to-device and well-to-well isolation, and improved latchup avoidance. However, the dielectric material used to fill STI isolation trenches that are formed within a substrate may be substantially eroded during post-trench processing.

This trench fill erosion results in one or more of: (1) adverse sidewall parasitic MOSFET devices being formed adjacent the active areas of an integrated circuit (IC); (2) reduced gate oxide integrity and reliability due to 90° sharp corners of the trench being incorporated into the desired MOS gate stack (this also greatly reduces the reliability of any nonvolatile memory (NVM) device made in these active areas); (3) various polysilicon stringer problems; (4) uncontrollable threshold voltage (Vt) variations from device-to-device and wafer-to-wafer; (5) "kinks" in MOSFET IV curves when operating in the linear MOS region; and (6) increased junction leakage current. Furthermore, the erosion of the trench fill material can be worsened by 2× or 3× in microcontrollers (MCUs) or digital signal processors (DSPs) that have two or three active areas that each use different active area or sacrificial oxide preparation and surface processing. For example, one MCU substrate may contain a floating gate EEPROM array, power MOSFETs, and high speed logic devices all formed on same chip in different active areas. Each of these areas may need different active area preparation and gate oxidization wherein the last area processed has been exposed to many RCA cleans, sac oxides, HF strips, etc., many of which will erode the trench fill material adjacent this last active area. For a 5000 angstrom deep trench, trench fill erosion of greater than 1000 angstroms has been experimentally observed in these mixed-signal multiple-active-area MCU and DSP devices.

FIGS. 1–5 specifically illustrate the trench erosion problem that occurs when conventional shallow trench isolation (STI) is used in integrated circuits (ICs).

FIG. 1 illustrates a conventional semiconductor trench structure 110. In FIG. 1, a semiconductor substrate or semiconductor wafer 112 is provided. A pad oxide or thermal oxide layer 114 is formed over the substrate 112. A thicker silicon nitride layer 116 is typically deposited on top of the thin oxide layer 114 to function as a hard mask. Conventional photolithographic processing is used to etch an opening 118 through the silicon nitride layer 16 and the oxide layer 114 to expose a top surface portion of the substrate 112. This opening in the dielectric layers 114 and 116 is then extended into the substrate by a silicon etch to form a shallow trench region 118, as shown in FIG. 1. After formation of the shallow trench region 118, a thermal oxidation process is utilized to form a thin oxide liner layer 117 on both the sidewalls and the bottom surface of the trench 118 in FIG. 1.

FIG. 2 illustrates that a trench fill layer 120a is conformally deposited within the trench 118 after formation of the liner 117. Layer 120a is typically formed as a tetraethylorthosilicate (TEOS) layer and is formed having a thickness much greater than a thickness of the silicon nitride layer 116. FIG. 2 illustrates a dashed line 119 within the layer 120a. Line 119 indicates a level to which the layer 120a will be subsequently polished to form a proper trench fill plug region using the silicon nitride layer 116 as a polish stop layer.

FIG. 3 illustrates the structure of FIG. 2 after chemical mechanical polishing (CMP) planarization of layer 120a of FIG. 2 has occurred. The CMP process forms a trench plug region 120b from the layer 120a illustrated previously in FIG. 2. As indicated in FIG. 3, a top surface 119 of the plug region 120b is roughly analogous to the dashed line 119 in FIG. 2. After chemical mechanical polishing (CMP) is complete, the silicon nitride layer 116, which is used as a chemical mechanical polish (CMP) stop, is then removed by a wet etch process that is very selective to oxide. After removal of the silicon nitride layer 116, at least one active area, indicated as active area 124, is defined at a top surface of the substrate 112 in FIG. 3. Electrical devices are subsequently formed within the active area 124 of the substrate 112 and interconnected by overlying conductive layers to form a functional IC.

FIG. 4 illustrates the adverse erosion of the trench fill plug 120b which occurs from subsequent processing of the active area 124 to form the active devices. After formation of the trench plug 120b in FIG. 3, the active area 124 is exposed to one or more etch processing steps, sacrificial oxide steps, and surface cleaning steps which will erode the dielectric plug material 120b over time. It is known in the art that TEOS layers will etch in oxide etch environments faster than thermally grown oxide layers. This faster etch rate of TEOS when compared to thermal oxide (e.g., gate oxides and most sacrificial oxides) will further exacerbate the erosion of the plug region 120b compared to other IC regions since the trench plug 120b is typically made of the faster-etching TEOS material.

FIG. 4 illustrates a plug region 120c which is the plug region 120b of FIG. 3 after being substantially eroded by subsequent semiconductor active area processing that is needed to make active circuitry in the region 124. As illustrated in FIG. 4, erosion of the plug to result in an eroded plug 120c forms an exposed sidewall 126 of the active silicon surface area 124. This sidewall area 126 is exposed to subsequent active area processing (e.g., gate oxide formation and gate polysilicon formation) whereby unwanted parasitic sidewall devices (e.g., an unwanted sidewall parasitic MOSFET) are formed on the sidewall 126 of the active area 124. Furthermore, the channel doping along this sidewall is such that the parasitic sidewall MOSFET will turn on before the top-surface planar MOSFET is turned on, thereby creating a "kink" in the Id-Vds characteristics of the MOSFET of FIG. 5 when the MOSFET is attempting to operate in the linear MOS region.

FIG. 5 illustrates a three-dimensional cross-sectional perspective of the device of FIG. 4. FIG. 5 illustrates the top surface of the active area 124 of FIG. 4 as well as the parasitic sidewall 126 which is adversely formed by trench fill erosion. FIG. 5 illustrates that a MOSFET source region 128 and a MOSFET drain region 130 are formed within the active area by conventional ion implantation and thermal activation. These source and drain region 128 and 130 are separated by a channel region 132 within the active area 124. As is known in the art, a gate dielectric layer (not specifically shown in FIG. 5) is formed over the channel region 132 and a conductive gate electrode (not specifically shown in FIG. 5) is then formed overlying this gate oxide and overlying the channel region 132. The gate electrode is used to control a conductivity of the channel region 132 between the current electrode regions 128 and 130 in FIG. 5.

Unfortunately, due to the erosion present in the trench plug region 120c, a parasitic MOSFET sidewall channel region 134 is present in the structure of FIG. 5 once the gate electrode is formed. Due to the fact that parasitic channel region 134 will be exposed to gate oxide formation and lie adjacent a portion of a subsequently formed gate electrode, the channel region 134 is a parasitic transistor channel region which is formed between the electrodes 128 and 130 in parallel to the desired channel region 132. Due to the fact that threshold (Vt) adjust implants, well region doping profiles, and other implanted regions are formed from the surface of the substrate, doping concentrations of dopant atoms in the substrate are not constant throughout the depth of the semiconductor substrate 112. Therefore, the threshold voltage of the vertical sidewall channel region 134 may be substantially different from a threshold voltage of the top channel region 132. Typically, a doping concentration of the region 134 integrated over the vertical sidewall will be greater or lesser than a doping concentration at the active area surface 132 depending upon the processing sequence. Therefore, the parasitic channel region 134 is likely to typically "turn on" and form a conductive inversion region (i.e., an unwanted parasitic leakage path) between the regions 128 and 130 before the actual transistor channel region 132 is "turned-on" creating undesirable MOSFET behavior.

In addition, if the sidewall of the channel region 134 of FIG. 5 is deep along the substrate sidewall 126, the likelihood of forming adverse polysilicon stringers when patterning polysilicon gate electrodes also increases. In addition, the erosion ensures that a 90° corner of silicon substrate (at a top of the sidewall 126 of FIG. 4) is thermally oxidized and incorporated into the final MOSFET gate stack. These sharp corners affect oxide breakdown voltage and adversely affect MOS lifetime, reliability, and performance. Increased junction leakage is also found due to the erosion shown in FIGS. 4–5. Therefore, this parasitic channel region 134 is disadvantageous altogether.

Note that the erosion of the sidewall is substantially worsened when multiple transistor devices having different gate oxides are formed in different parts of an IC substrate. Today, it is desired to integrate many different devices (e.g., bipolar devices, logic MOSFETs, floating gate devices, high voltage MOSFET, etc.) together on the same integrated circuit (IC). If a surface among N surfaces is repeatedly exposed to N surface cleans, sacrificial oxidations, and the like, where N is a finite positive integer, the erosion of the trench adjacent this surface is worsened roughly by the factor of N. In other words, trench erosion of 350 Angstroms for a single gate oxide IC may easily be 1000 Angstroms or more for a device requiring three different gate oxide regions on the same die. Therefore, the trench erosion problem is extremely damaging to multiple gate oxide ICs that involve mixed technology (as typically found in modern microcontrollers (MCUs) and digital signal processors (DSPs)).

One way to reduce the adverse erosion of the trench region 20c as illustrated in FIG. 5 is to expose the trench region 120c to fewer etch environments. The prior art has attempted to reduce the amount of wet etching and reactive ion etching (RIE) of the trench fill material 120c by reducing the amount of processing in the active area 124. However, for each etch and/or clean process removed from the overall semiconductor flow, the active area 124 is not being fully or adequately processed in accordance with general IC processing standards. As a result, integrated circuit (IC) yield in the active area and/or IC performance may be adversely impacted due to reduced surface-clean processing and reduced active area etch processing. In any event, this reduction in active area cleaning and preparation does not truly prevent erosion, but merely attempts to reduce its severity.

Another solution attempted in the prior art is to form the liner 117 of FIG. 1 from a silicon nitride layer or a silicon oxynitride layer. This silicon nitride liner 117 will not etch substantially in oxide/TEOS etch environments and will not etch substantially in substrate cleaning processes. Therefore, through use of this nitrided liner, the sidewall erosion of the trench fill material 120c may be reduced by the sidewall presence of silicon nitride or oxynitride 117. However, silicon nitride, in contact with a silicon substrate, has been shown to cause stress induced defects near the active area which adversely impacts MOSFET devices. Furthermore, any deposition of additional material within the trench may change the aspect ratio of the trench opening 118 thereby adversely affecting subsequent deposition processing and trench filling.

Also, if the trench fill erosion were still to occur (as is likely the case if the nitride liner is surrounded by TEOS trench fill) the exposed sidewall 126 of FIG. 4 would be covered with the silicon nitride liner 117. This silicon nitride liner is most likely non-oxidizable. Therefore, a sidewall parasitic MOSFET having a thin silicon nitride gate oxide layer (with a dielectric permittivity roughly twice that of thermal oxide) will be formed. This parasitic device may actually create more damaging sidewall parasitic MOSFET behavior than the sidewall parasitic MOSFET that results from the use of the conventional thermal oxidized trench liners as in FIGS. 4–5. In addition, the presence of both exposed oxide surfaces and exposed nitride surfaces when forming the trench layer 120a in FIG. 2 adversely affects the conformality and selectivity of the TEOS deposition process of FIG. 2. Therefore, the increased complexity and risk from using a nitride or nitrided trench fill liner is not always advantageous. In any event, this "solution" does not prevent trench fill erosion but merely attempts to reduce its severity.

In another embodiment, a polysilicon layer may be deposited within the trench 118 formed in FIG. 1 whereby this polysilicon fill can be thermally oxidized to form a polysilicon-oxide liner 117 in the hope of reducing sidewall erosion of the region 120c. Note that polysilicon-oxide (polyox) is similar to thermal oxide in that it etches slower than conventional TEOS liners which could reduce overall trench erosion over time. However, this process adds at least one other process step to the process flow (e.g., it adds at least the additional step of the deposition of the polysilicon), and may decrease a lateral dimension of the trench whereby filling of the trench via subsequent dielectric deposition processing is more complicated. In any event, this does not prevent erosion but merely attempts to reduce its severity.

Some prior art trench processes form conductive or semi-conductive trench fills such as silicon germanium or polysilicon. These conductive or semiconductive trench fill regions are then oxidized so that no overlying conductive layers (such as gate polysilicon) contact or capacitively couple to these conductive fill regions. These oxide capped semiconductive filled trench regions are dangerous to use when erosion is a severe problem. If the oxide on top of the semiconductive or conductive trench fill erodes, then increased capacitive coupling, loss of effective device-to-device isolation, and electrical short circuiting of layers may occur in addition to all of the erosion disadvantages taught above with respect to FIGS. 1–5.

Therefore, a need exists in the industry for a shallow trench isolation process that eliminates or substantially retards trench fill erosion. It would be even more advantageous if this process would enable mixed signal, or multiple active area MCUs or DSPs to be formed without the hazards of trench fill erosion.

Figure 1:
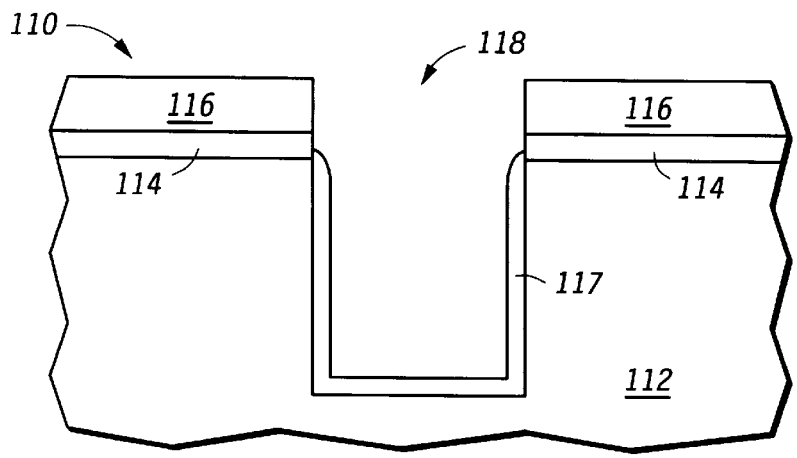
FIGS. 1–5 illustrates, in cross-sectional diagrams, the problem of trench fill erosion in integrated circuit processing, as is known in the prior art.
Figure 2:
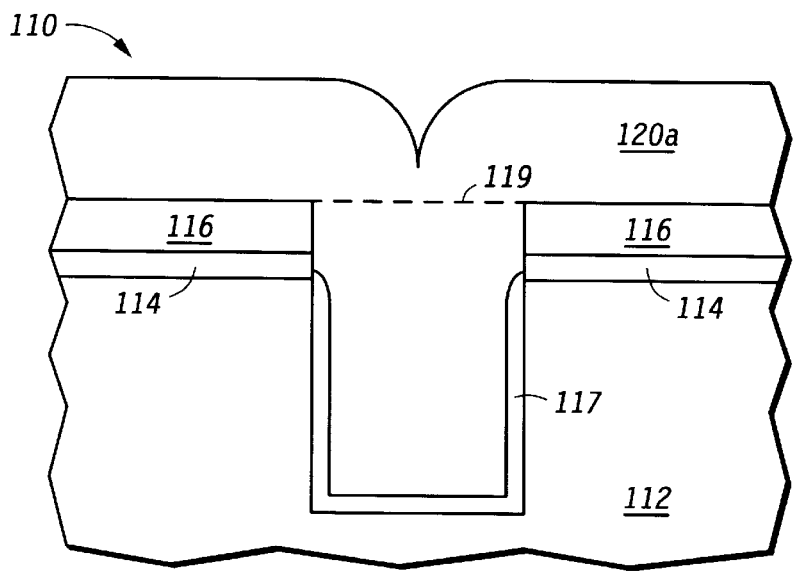
Figure 3:
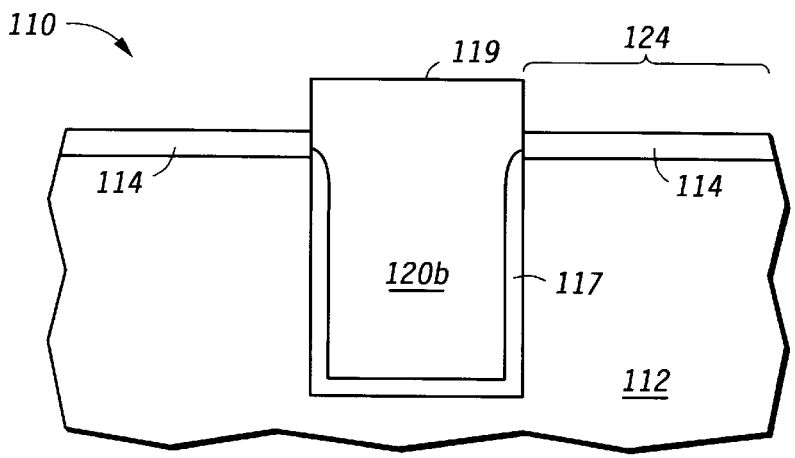

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method for forming a capped shallow trench isolation (CaSTI) integrated circuit (IC) structure. Generally, the method begins by forming one or more trench regions within a substrate. After liner processing of the trench, a bottom portion of the trench region is then filled with a tetraethylorthosilicate (TEOS) material or a high density plasma (HDP) oxide. A silicon nitride or oxynitride cap region is then formed on top of the underlying TEOS fill wherein this nitrided cap is formed within a top portion of the trench region. This silicon nitride cap isolates the underlying TEOS oxide trench fill material from any subsequent active area processing for any number of active areas. The nitride cap therefore substantially prevents the underlying oxide trench fill from being eroded over time.

Specifically, the nitride cap on the oxide trench fill will very likely totally eliminate adverse sidewall parasitic MOSFET device formation, increase gate oxide integrity by removing 90% sharp corners from the gate electrode structure, reduce or avoid the polysilicon stringer problem, remove kinks or threshold voltage control problems with MOSFET devices, reduce junction leakage current, and allow for more efficient and high yield formation of microcontrollers (MCUs) and digital signal processor (DSPs) which are mixed signal in nature or contain a plurality of active areas which must each be processed with different substrate cleans, sacrificial oxidations, and oxide strips.

The invention can be further understood with specific reference to FIGS. 6–25.

A First Embodiment

Figure 6:
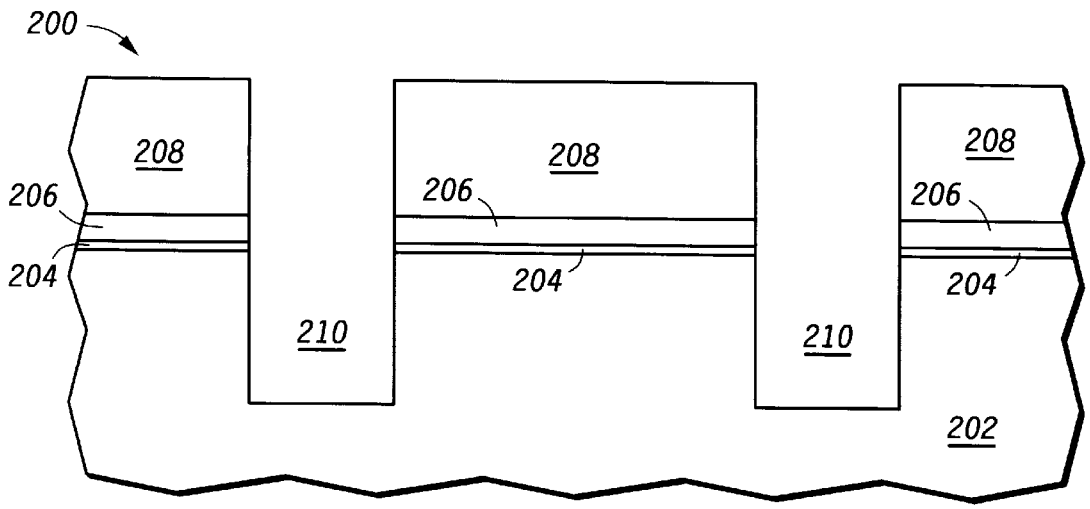
FIGS. 6–14 illustrate, in cross-sectional diagrams, a method of forming an integrated circuit (IC) having capped shallow trench isolation (CaSTI) structures in accordance with the present invention.

A first embodiment of the capped shallow trench isolation (CaSTI) process is illustrated in FIGS. 6–14. FIG. 6 illustrates the beginning processing steps which are used to form a capped shallow trench isolation (CaSTI) semiconductor structure 200. Structure 200 contains a semiconductor substrate 202. Typical semiconductor substrates 202 are either silicon wafers, gallium arsenide substrates, germanium substrates, germanium silicon substrates, silicon on insulator (SOI) substrates, epitaxial formations, silicon carbide, or the like. FIG. 6 illustrates that a pad oxide 204 is formed on top of the semiconductor substrate 202. Preferably, the layer 204 is a thermally grown oxide layer which is made of silicon dioxide. Preferably, the layer 204 has a thickness between roughly 50 Å and 250 Å with a thickness of roughly 150 Å being preferred.

A masking layer 206 or a hard mask 206 is then formed overlying the pad oxide 204. In the embodiment illustrated in FIGS. 6–14, the masking layer 206 is preferably made of polysilicon. A typical thickness of the polysilicon layer 206 is within the range of roughly 800 Å to 2000 Å. It is important to note that the polysilicon layer 206 of FIG. 6 may be replaced by other materials such as amorphous silicon, epitaxial silicon, germanium silicon, gallium arsenide, composite semiconductive layers, and the like. In a preferred form, the layer 206 is any layer that can be etched preferentially to both oxide and silicon nitride.

After formation of the masking layer 206, a photoresist layer 208 is formed over a top surface of the layer 206. This photoresist is exposed selectively to light through a lithographic mask and is chemically developed to form an opening which exposes a top surface of the masking layer 206. The structure 200 of FIG. 6 is then exposed to a silicon reactive ion etch (RIE) chemistry or a like silicon plasma etch in order to directionally etch the polysilicon 206 that lies within the openings made in the photoresist 208. This etch is relatively selective to the pad oxide 204, and will stop once a top surface of the pad oxide 204 is substantially exposed. Once the pad oxide 204 is exposed within the opening formed through the photoresist 208, the etch chemistry is switched to a reactive ion etch (RIE) or plasma etch which etches silicon dioxide selective to the silicon substrate 202. After etching the pad oxide 204 for a period of time, a top surface of the silicon substrate 202 is exposed. At this point, the etch chemistry is again switched to a silicon plasma or RIE etch chemistry which directionally etches the trenches 210 within the substrate 202 as illustrated in FIG. 6. The regions 210 are shallow trench isolation (STI) regions and are typically formed between 3000 Å and 7000 Å in depth into the substrate 202. After formation of the trenches 210 in FIG. 6, the photoresist layer 208 is stripped from a surface of the substrate, preferably by an $O_2$ ash process.

Figure 7:
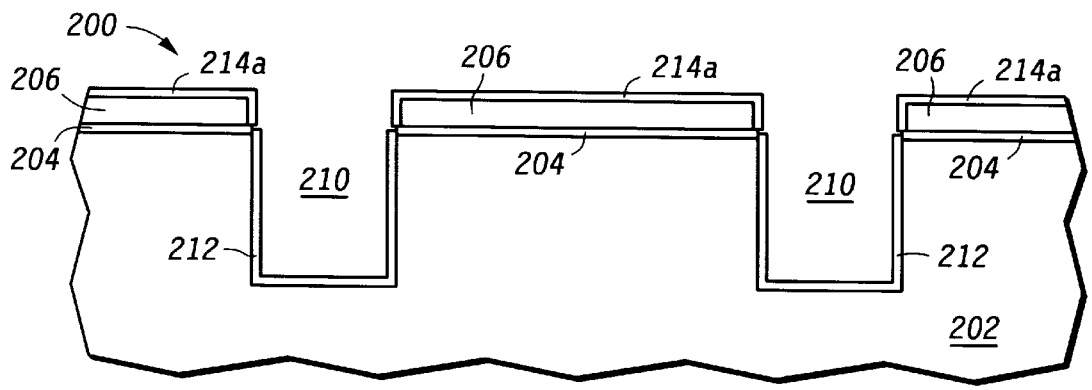

FIG. 7 illustrates that the trench 210 and the polysilicon masking layer 206 are exposed to an oxidation ambient. This oxidizing ambient results in the formation of a thermal oxide liner 212 along vertical sidewalls in a bottom portion of the trenches 210 illustrated in FIG. 7. The same oxidation ambient will result in a polysilicon oxide (polyox) being formed along the sidewall and top portion of the polysilicon masking layer 206. This polysilicon oxidation will form a polysilicon oxide layer 214a as illustrated in FIG. 7. Generally, polysilicon will oxidize at a faster rate than single crystal silicon whereby the layer 214a and the layer 212 will be of different thicknesses, with layer 214a generally having a thicker dimension. It is preferred that the polysilicon masking layer 206 partially remains in FIG. 7 after the step of liner oxidation. Full consumption of the layer 206 by the sidewall liner oxidation process, while not being extremely problematic, may complicate the chemical mechanical polishing processes which are to follow in subsequent figures. Generally, the liner 212 is formed to a thickness of roughly 100 Å to 500 Å with roughly 200 Å being optimal. At a 200 Å optimal thickness, the layer 214a will be roughly 200 Å to 300 Å thick. As indicated earlier, with the layer 206 being 1000 Å to 2000 Å thick, the liner oxidation that results in the formation of the layer 206 will not completely consume the polysilicon layer 206, which is preferred but not required in the present embodiment.

Figure 8:
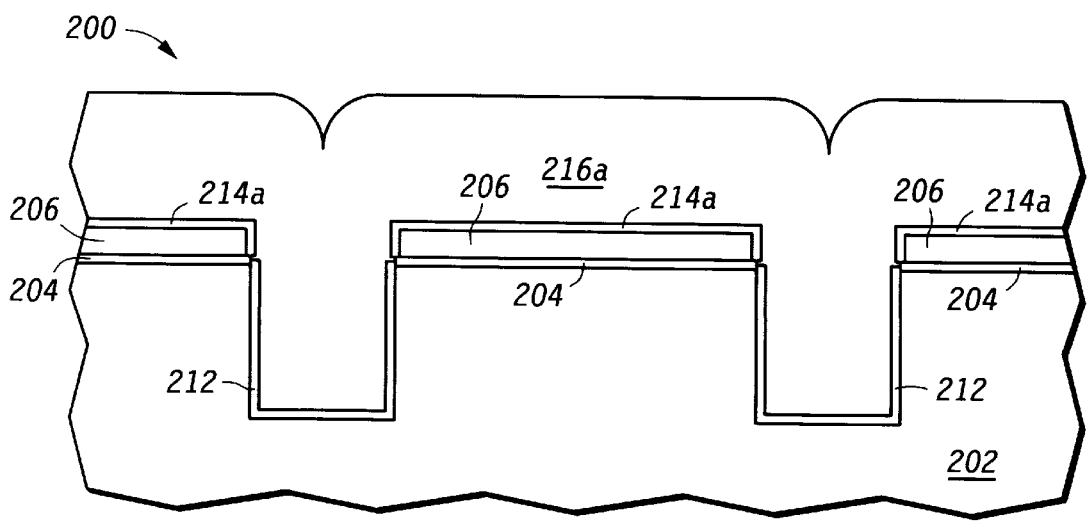

FIG. 8 illustrates that a trench fill material 216a is deposited, sputtered, or spin-coated over a top surface of the wafer 202. This layer 216a is preferably an ozone TEOS material, a furnace TEOS material, a high density plasma (HDP) oxide, or some combination thereof. Generally, the trench fill layer is deposited to a thickness of roughly 3000 Å to 9000 Å. The layer 216a will completely fill the openings 212 of FIG. 7 and overlie a top surface of the layer 214a. While densification may occur in FIG. 8, it may be necessary to take precautions which ensure that the polysilicon layer 206 is not oxidized by this densification process. These precautions may be in the form of forming a nitride capping layer and an optional protective nitride sidewall spacer around the polysilicon layer 206 in FIG. 6 before the photoresist layer 208 is formed. In the case of HDP oxide, no densification is needed and no additional protection of polysilicon layer 206 is required. Furthermore, densification may either be brief, altered, foregone, or performed in a non-oxidizing ambient in order to preserve the polysilicon layer 206 in FIG. 8.

Figure 9:
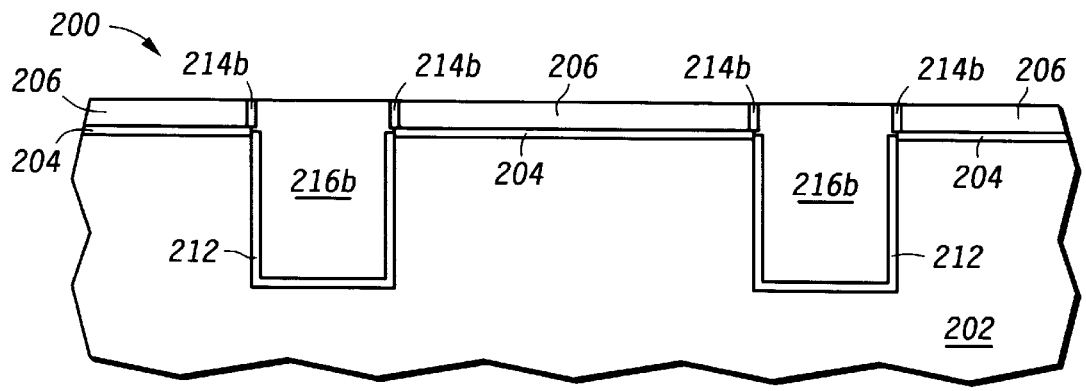

FIG. 9 illustrates that chemical mechanical polishing (CMP) is used to polish the layer 216a of FIG. 8 selective to the polysilicon layer 206. While this planarization process is typically performed using chemical mechanical polishing (CMP), other processes such as wet etching, reverse masking and etching, resist etch back (REB), and combinations of these technologies with CMP may be used to form the planar surface illustrated in FIG. 9. After the chemical mechanical polishing process of FIG. 9, a top portion of the layer 214a has been removed along with a top portion of layer 216a. What remains behind after the planarization process of FIG. 9 are the sidewall portions of the poly oxide 214b illustrated in FIG. 9, and the oxide trench plug regions 216b illustrated in FIG. 9.

Figure 10:
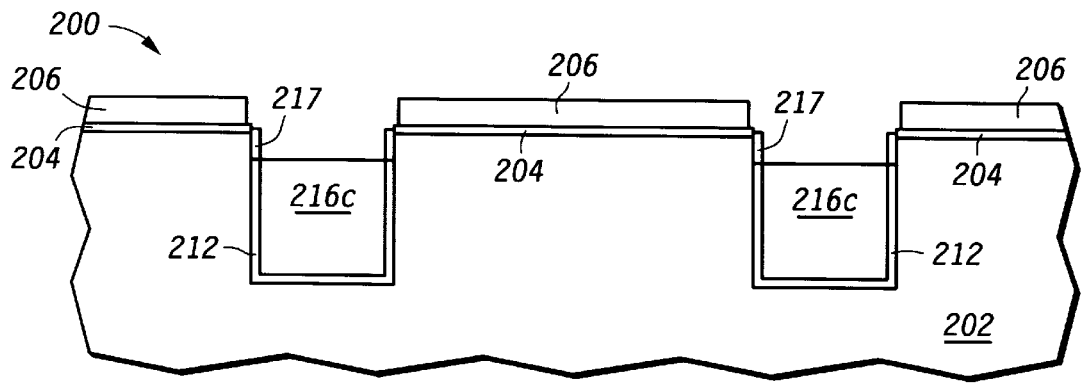

FIG. 10 illustrates that the poly oxide 214b, very thin peripheral portions of the pad oxide 204, top portions of the sidewall liner 212, and the trench plug region 216b are exposed to an oxide etch. Preferably, this oxide etch is a reactive ion etch (RIE) using an oxide etching species followed by a brief wet etch. For example, one etch chemistry that may be used is an RIE $CF_4$ with $CHF_3$ followed by a brief buffered HF dip. In another form, a longer wet etch may be used, however, care should be used that this wet etch does not significantly laterally recess the pad oxide 204. In another form, any ordered combination of one or more wet etch and reactive ion etch or plasma etch steps may be used to remove portions of layer 214b, the liner 212, and a top portion of the trench plug region 216b. It is important that the etch time used to recess the layer 216b to form the recess trench plug region 216c in FIG. 10 is long enough to expose some portion of the sidewall of the substrate 202 within the trench region.

After performing this oxide recess process of FIG. 10, an optional thermal oxidation process is shown. This thermal oxidation process is optional, and when used will form a second liner 217 along exposed sidewall portions of the substrate 202 in FIG. 10. Preferably, to avoid damaging sidewall recession of this layer 217 later on in the process when active areas are prepared, the layer 217 should be a thin layer of roughly 50 Å to 150 Å. This thin layer will ensure that any recessing of this layer during active area processing is corrected by the gate oxidation of active devices in the active area so processed.

This layer 217 is optional since the layer 217 is used only so that subsequently deposited nitride layers are not in direct contact with the substrate. It is known that silicon nitride in contact with silicon material can result in stress related defects. However, since the surface area covered by the layer 217 is so small, the absence of layer 217 in FIG. 10 should not be a significant problem. The substrate surface area in contact with subsequently deposited nitride should be small enough to avoid significant stress related defects even absent layer 217. In addition, the layer 217 can be made of an oxynitride layer or other deposited oxide films which resists subsequent erosion while simultaneously providing some stress relief between subsequently deposited silicon nitride layers and the silicon substrate 202.

Figure 11:
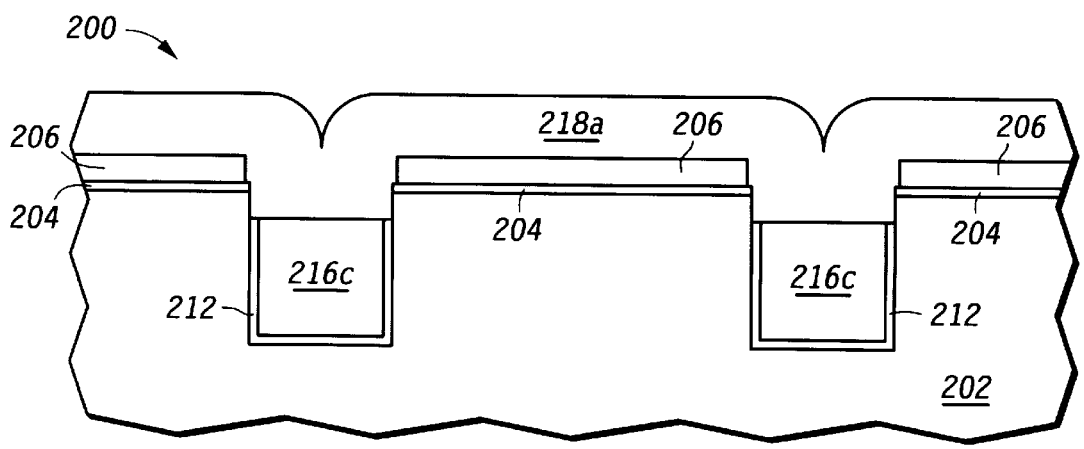

FIG. 11 illustrates that a silicon nitride layer 218a is deposited over the recessed oxide trench fill regions 216c. Typically, the silicon nitride layer 218a is deposited to a thickness of roughly 500 Å to 2500 Å. In another form, the layer 218a may be formed as a nitrogen-rich silicon oxynitride layer or a silicon-rich silicon nitride layer.

Figure 12:
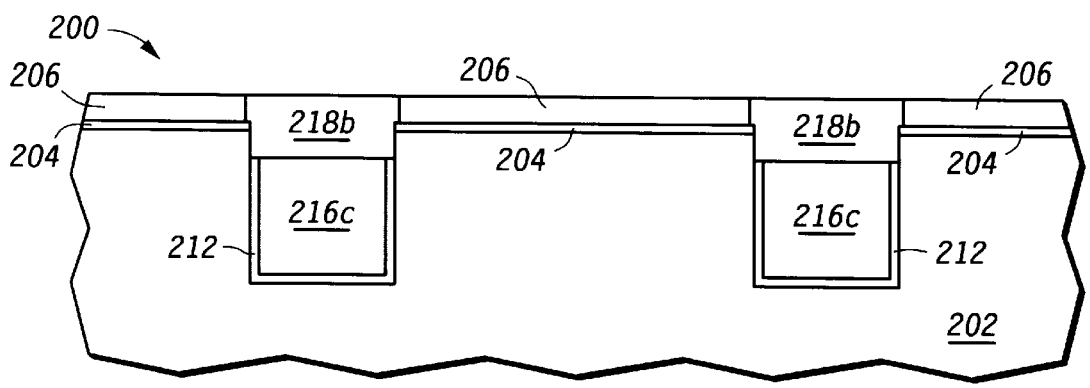

FIG. 12 illustrates that a resist etch back (REB) process, a chemical mechanical polishing (CMP) process, or some combination thereof is used to polish the layer 218a to form capping regions 218b from the layer 218a. Therefore, FIG. 12 illustrates that a top portion of the trench region has been capped by silicon nitride or like layer 218b whereby the silicon nitride layer 218b will protect the underlying bulk trench fill material 216c. The polished process performed in FIG. 12 is performed selective to the polysilicon layer 206 in FIG. 12.

Figure 13:
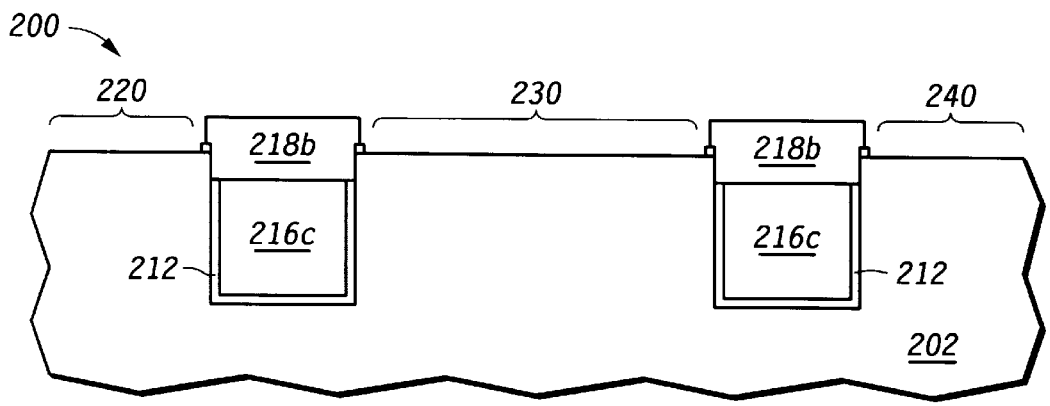

FIG. 13 illustrates that a wet, a dry, or a combination of wet and dry etching is used to remove the polysilicon layer 206 from the wafer structure 200. After removal of the layer 206, selective to the silicon nitride 218b, a selective wet, dry, or wet and dry etch process is used to remove the pad oxide 204 selective to the silicon nitride 218b as illustrated in FIG. 13. Therefore, FIG. 13 illustrates a capped shallow trench isolation (CaSTI) structure having an oxide or TEOS bulk 216c below a silicon nitride or oxynitride capping layer 218b. Specifically, the CaSTI regions in FIG. 13 define three active regions 220, 230, and 240. These active regions 220, 230, and 240 can be processed by RCA cleans, HF buffered etches, sacrificial oxides, and many other active area preparation and MOSFET processing techniques while the nitride capping layer 218b will substantially prevent any erosion and substantially protect the underlying bulk trench fill material 216c from erosion as shown in FIGS. 4–5 herein.

Figure 4:
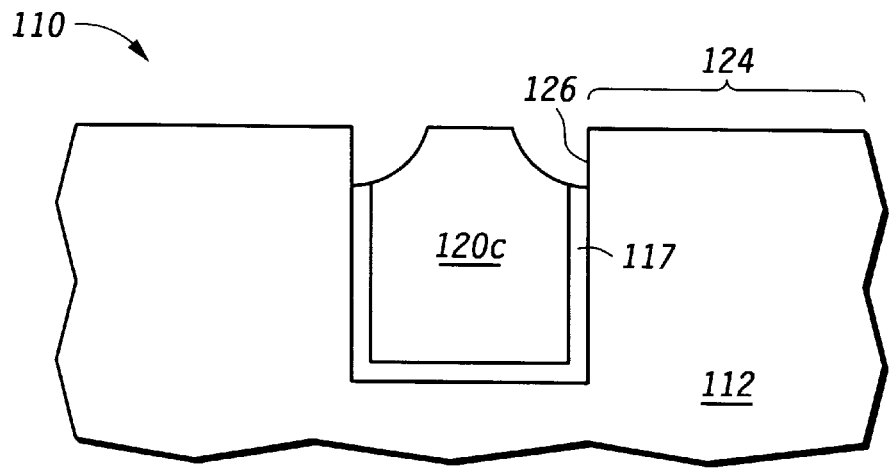
Figure 5:
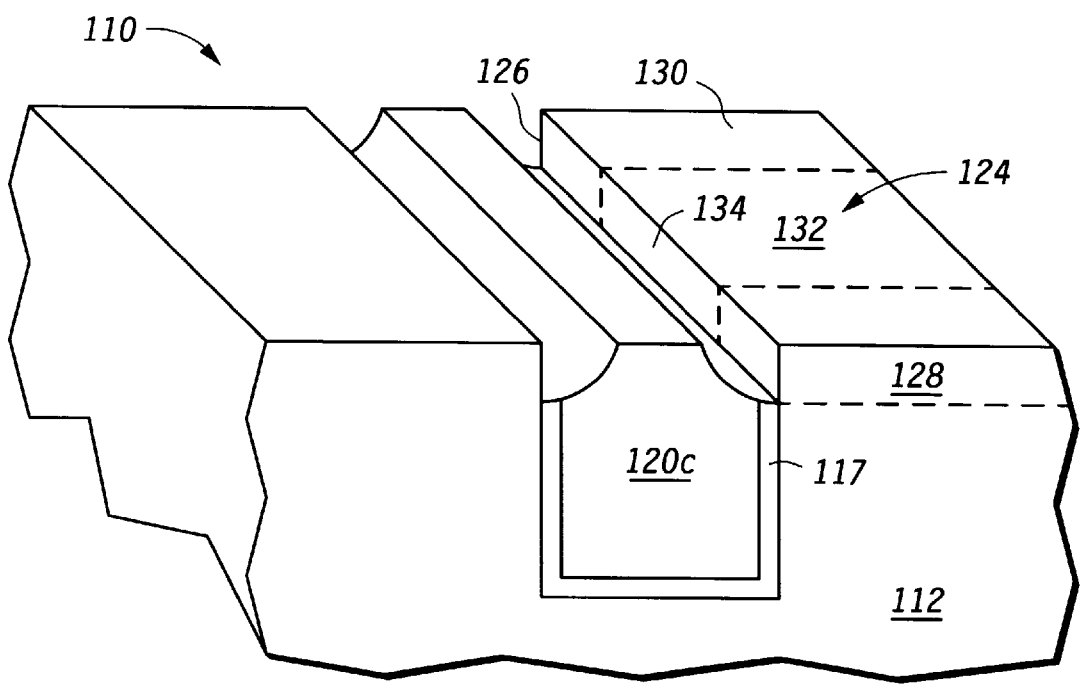

Due to this additional protection provided by the silicon nitride capping region 218b, the active areas 220–240 can be processed with many sequential processing steps and still not result in any significant sidewall erosion whereby adverse sidewall parasitic MOSFET devices as illustrated in prior art FIGS. 4 and 5 are avoided or significantly reduced in impact. In addition, 90° sharp angles at the interface of trench regions to the silicon substrate near the top of active areas are likely to be entirely removed from the gate dielectric and gate polysilicon stack whereby gate oxide integrity and reliability will be improved for devices formed onto the substrate of FIG. 13. In addition, polysilicon stringer problems may be significantly reduced using the process taught in this embodiment. Also, threshold voltage (Vt) differences due to the reduction in the sidewall parasitic MOSFET formation will be avoided whereby consistent threshold voltages and consistent MOSFET operation within the MOS linear Id-Vd region should be capable of being formed. Reduced junction leakage should occur, and the formation of mixed signal and multi-active area digital signal processors (DSPs) and microcontrollers (MCUs) should be possible.

Figure 14:
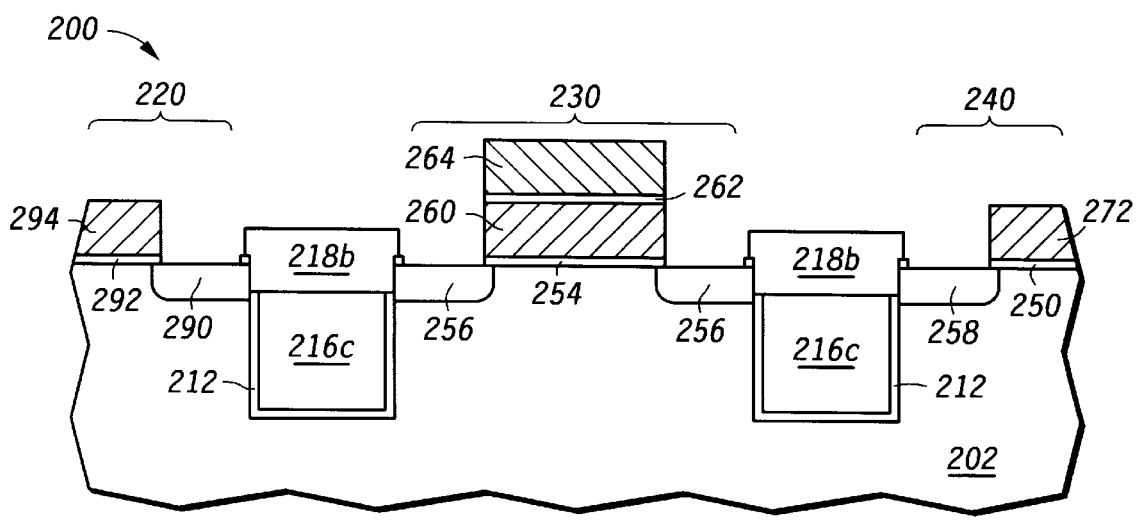

FIG. 14 illustrates the formation of these mixed signal DSP or MCU devices into the structure of FIG. 13. In the active region 220, a power MOSFET device is formed having source and drain regions 290, a thick silicon dioxide gate dielectric 292 which is typically 150 Å to 500 Å in thickness, and a polysilicon gate electrode 294. In active area 230, a nonvolatile memory (NVM) device such as a floating gate device, an EPROM, a EEPROM, a flash device, or the like is formed. This floating gate device has source and drain regions 256, a gate dielectric 254 which is typically between 70 Å and 110 Å in thickness in order to enable tunneling or hot carrier injection, a floating gate electrode 260, an interlevel dielectric (ILD) 262 which is preferably oxide-nitride-oxide (ONO), and a control gate polysilicon layer 264. While active area 230 illustrates a NVM device, other devices may be formed inactive area 230 such as embedded DRAM devices. These devices in area 230 probably require active area preparation and various processing steps that are substantially different from the MOS processing performed in regions 220 and 240. In addition, a high speed logic device is formed in active area 240 having a thin silicon dioxide gate dielectric 250, source and drain regions 258, and a polysilicon gate electrode 272. Therefore, FIG. 14 should clearly illustrate that multiple active areas may be processed and exposed to many different oxide eroding environments whereby the silicon nitride cap 218b will fully prevent or substantially reduce any adverse erosion of the oxide bulk trench fill material 216c.

A Second Embodiment

Figure 15:
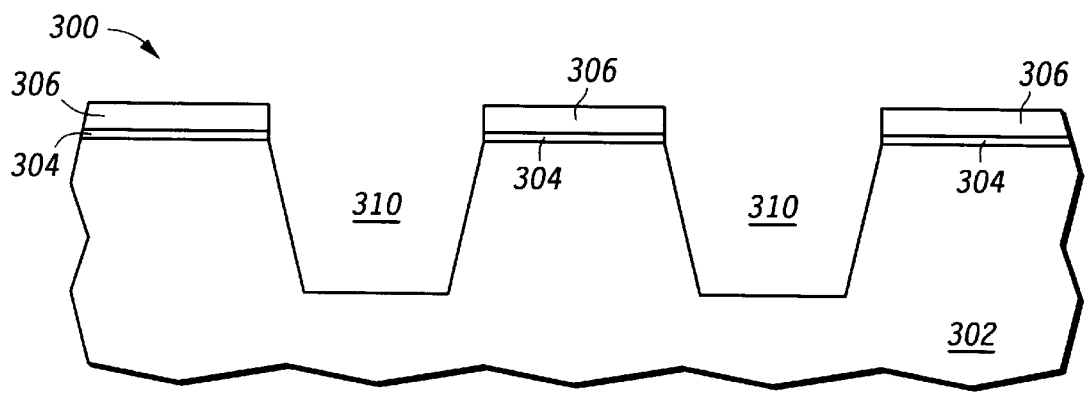
FIGS. 15–22 illustrate, in cross-sectional diagrams, another method of forming an integrated circuit (IC) having capped shallow trench isolation (CaSTI) structures in accordance with the present invention.

A second embodiment of the capped shallow trench isolation (CaSTI) process is illustrated in FIGS. 15–22. In FIG. 15, a capped shallow trench isolation (CaSTI) structure 300 is illustrated. FIG. 15 contains a substrate 302 that is analogous to the substrate 202 of FIGS. 6–14. In addition, FIG. 15 illustrates a pad oxide layer 304 which is analogous to the pad oxide layer 204 of FIGS. 6–14. Instead of using a polysilicon or a semiconductive masking region as in FIG. 6, the embodiment of FIGS. 15–22 uses a silicon nitride hard mask or a silicon nitride masking layer 306. Similar photolithographic processing and etch techniques as that discussed in FIG. 6 are used in FIG. 15 to form shallow trench isolation regions 310 which are analogous to the regions 210 in FIG. 6.

Figure 16:
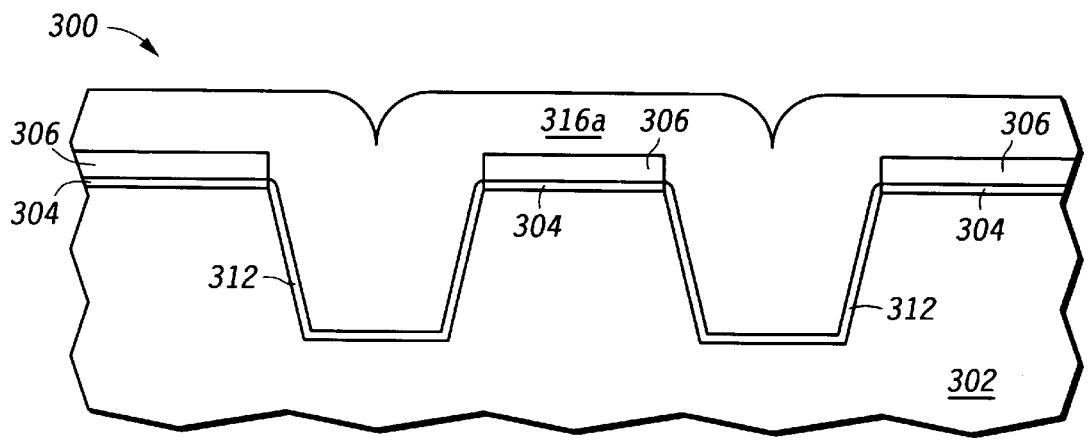
Figure 17:
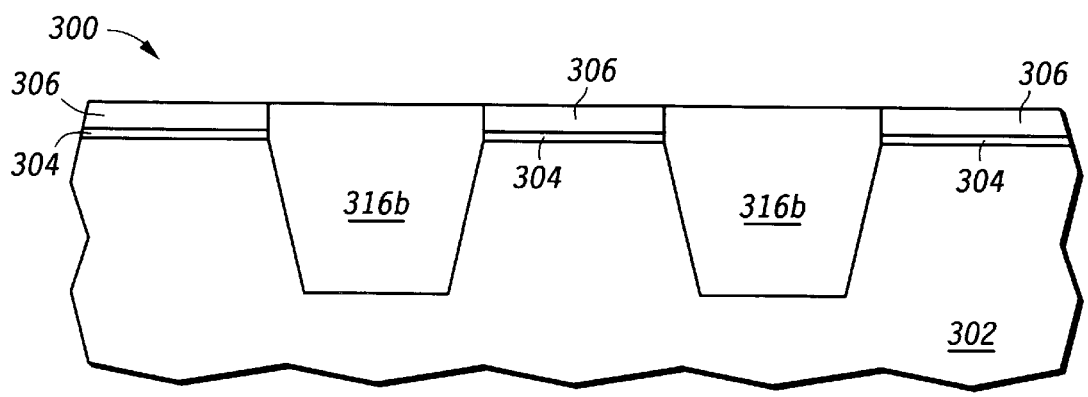
Figure 18:
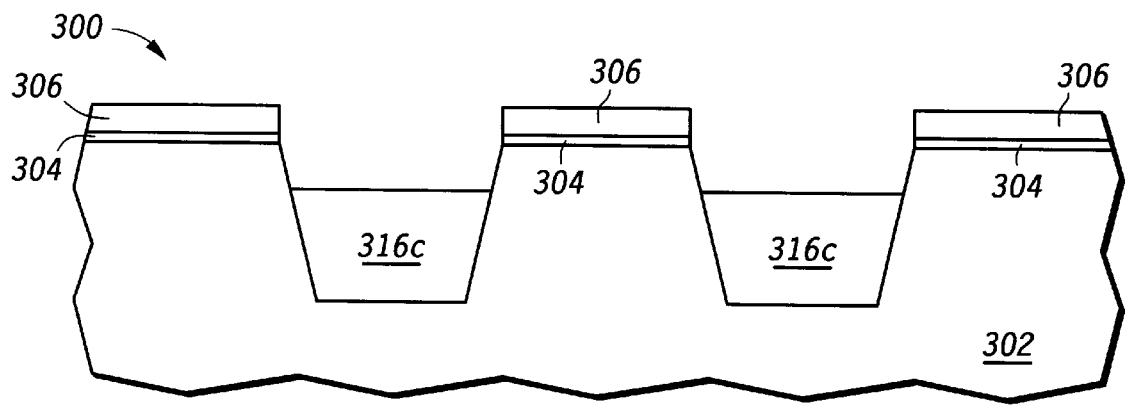
Figure 19:
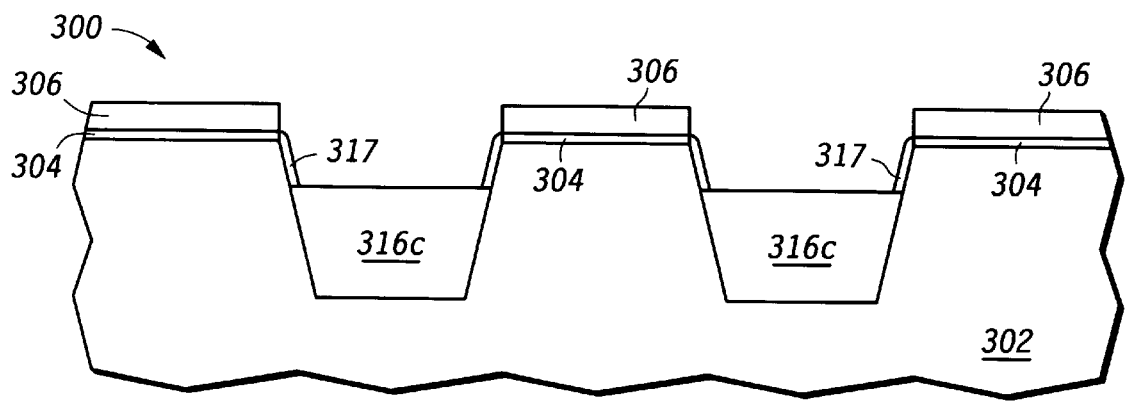

Sidewall and bottom trench oxidation is used to form a trench liner 312 in FIG. 16. Layer 312 is analogous to layer 212 in FIG. 7. Bulk trench fill deposition occurs to form a thick TEOS or HDP layer 316a which is analogous to the layer 216a in FIG. 8. FIG. 17 illustrates that a chemical mechanical polishing (CMP) process or a like planarization process is used to polish the layer 316a from FIG. 16 to form plug regions 316b in FIG. 17. FIG. 18 illustrates that a dry etch, a reactive ion etch (RIE), a plasma etch, a wet etch, or any combination thereof is used to recess the plug regions 316b to form recessed plug regions 316c. FIG. 19 illustrates that an optional sidewall liner oxide (SLO) may be used to protect exposed silicon 302 from any subsequent nitride deposition. In addition, the layer 317 may also be an oxynitride layer as was previously discussed for the analogous layer 217 of FIG. 10. Recess of layer 317 is unlikely due to its dimension and wet etch surface tension. Any recess in this area, if any, will be filled with subsequent oxidation as in the first embodiment herein.

Figure 20:
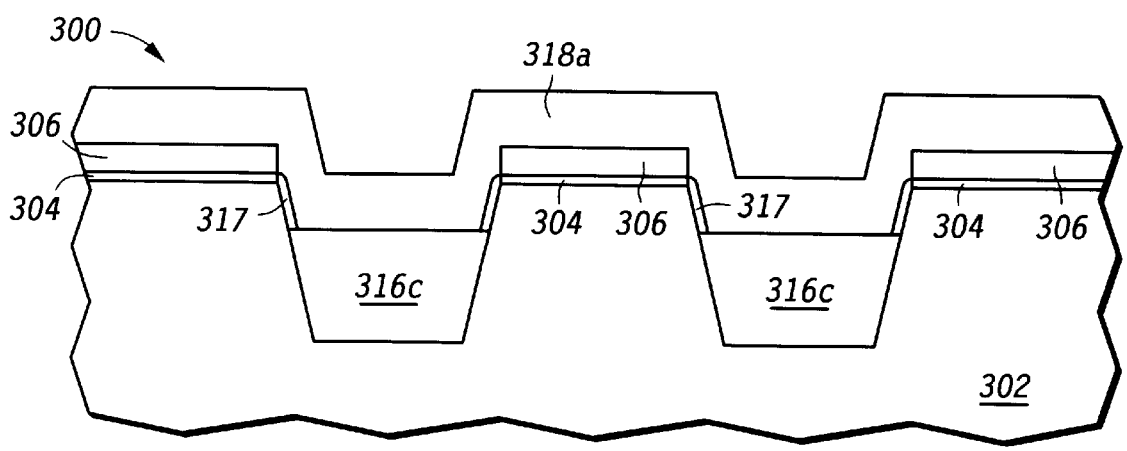
Figure 21:
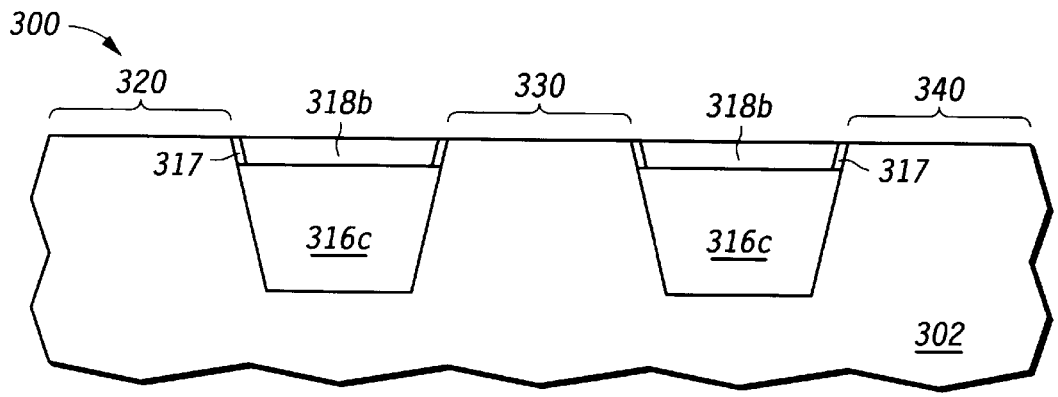

After optional formation of the layer 317, a silicon nitride or oxynitride deposition process is used to form a layer 318a in FIG. 20 which is analogous to the layer 218a of FIG. 11. A planarization process, such as CMP, is used to polish the layer 318a from FIG. 20 to form a nitride capping layer 318b as illustrated in FIG. 21. A primary difference between the process of FIGS. 15–22 and the process of FIGS. 6–14 is that the process of FIGS. 6–14 does not result in the abrasive polishing of any active areas. The polish illustrated in FIGS. 20 and 21 may result in some erosion or abrasion of the active areas 320, 330, and 340. This abrasion may be corrected by performing post polishing cleans and processes to correct any damage any nitride polishing may have caused in FIGS. 20 and 21. However, the process of FIGS. 15–22 results in a more planar final surface after trench fill. This more planar surface may reduce polysilicon stringer problems.

Figure 22:
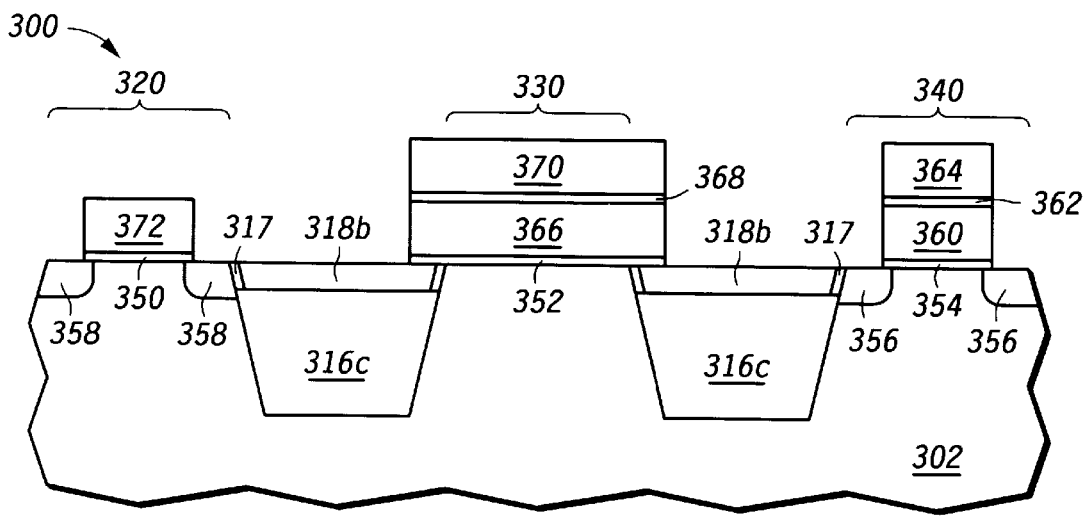

FIG. 22 illustrates the mixed signal or multi-active area advantages of using the nitride capped shallow trench isolation process taught herein. FIG. 22 illustrates that an active area 320 is used to form a logic CMOS transistor device having a gate oxide 350, source and drain regions 358, and gate electrodes 372. Active area 330 is used to form an E²PROM device having a tunnel dielectric 352, a floating gate 366, an ILD 368, and a control gate 370. Yet another active area 340 is illustrated as supporting an EPROM gate having a tunnel oxide 354, source and drain regions 356, a floating gate 360, an interlevel dielectric (ILD) 362, and a control gate 364. This second embodiment illustrated in FIGS. 15–22 is similar in advantages to all of the advantages discussed with respect to FIGS. 6–14.

A Third Embodiment

Figure 23:
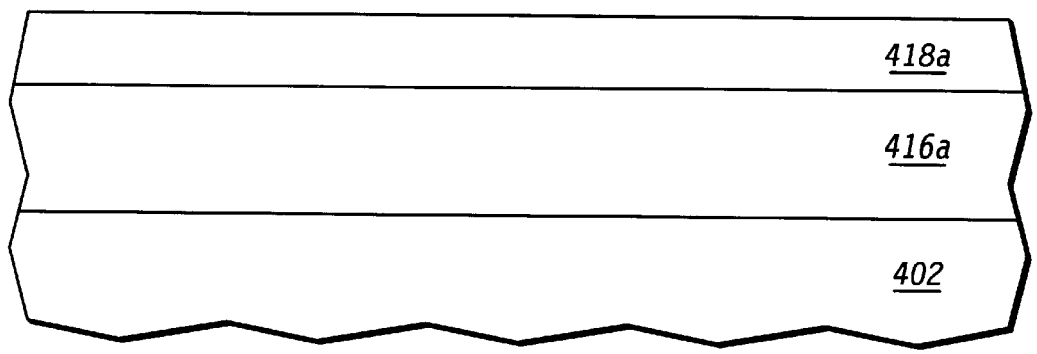
FIGS. 23–25 illustrate, in cross-sectional diagrams, yet another method of forming an integrated circuit (IC) having capped shallow trench isolation (CaSTI) structures in accordance with the present invention.
Figure 24:
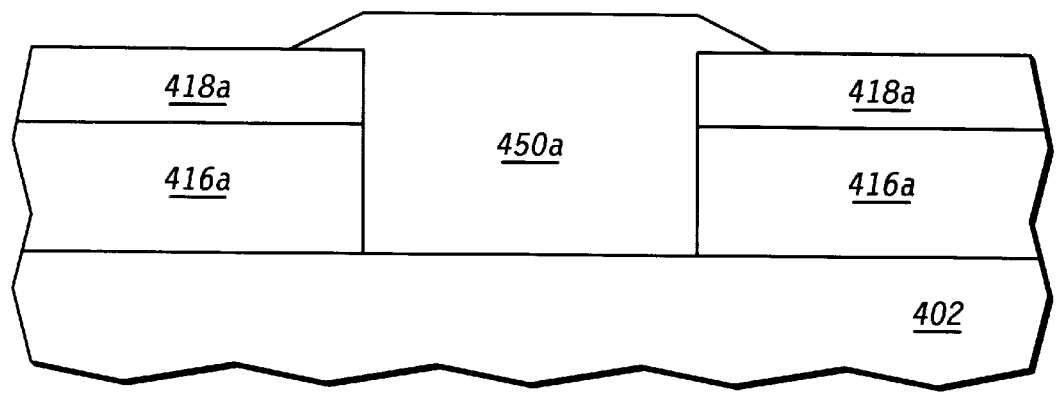
Figure 25:
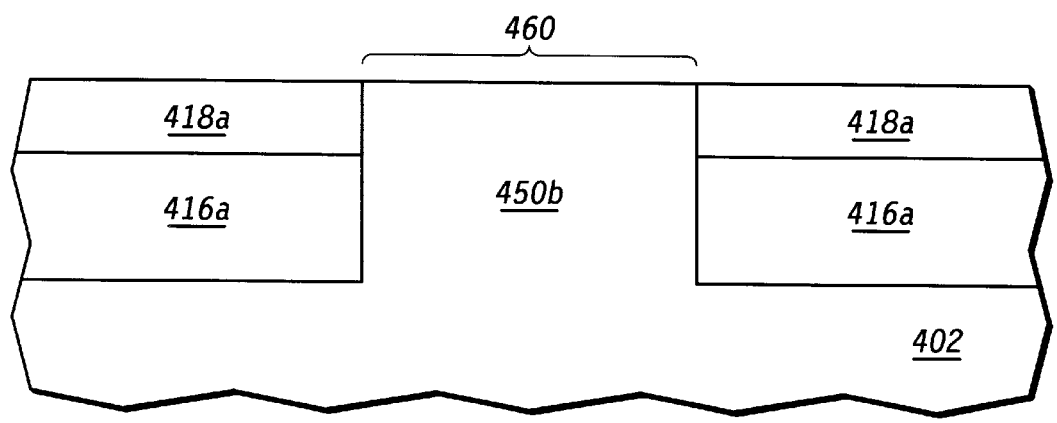

FIGS. 23–25 illustrate a third embodiment of the capped shallow trench isolation (CaSTI) structure. FIG. 23 illustrates that a substrate 402 is provided. A thick TEOS or HDP layer 416a is formed and densified over substrate 402. A thin capping silicon nitride layer 418a is then formed over a top of the layer 416a. Photolithographic processing and etch techniques are then used to etch an opening through the layers 418a and 416a to expose a top surface of the substrate 402 as illustrated in FIG. 24. Selective epitaxial growth can then used to form a silicon epitaxial region 450a as illustrated in FIG. 24. Since selective epitaxial growth suffers from non-uniformity, over growth is used as illustrated in FIG. 24 to ensure the silicon is properly progressed vertically through the opening formed in layers 416a and 418a for all openings on a semiconductor wafer 402. After overgrowth, FIG. 25 illustrates that a chemical mechanical polishing process of silicon selective to nitride is used to form active area 460 within the semiconductor structure.

While the process of FIGS. 23–25 seem easier to perform than the processing previously illustrated in FIGS. 6–22, selective epitaxial growth, while possible, is not easy to yield consistently at high volume levels. This lack of yield could result in non-competitively priced integrated circuit products. However, some products could benefit from using the process of FIGS. 23–25 in lieu of the processes illustrated in FIG. 6 through FIG. 22, even with the reduced yield.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the silicon nitride capping layer 218b may be RIE etched after or before planarization for form nitride spacers as the capping layer. This spacer capping layer will only protect corners of the trench fill where protection is critical and will not protect the central non-critical portions of the trench fill material. Also a top portion of the TEOS fill layer may be converted to oxynitride or a like material by ion implantation of nitrogen. Furthermore, the capping layer 218b of FIG. 13 may be RIE etched by a nitride etch environment to reduce its height and thereby reduce stringer problems. The trench fill material 216c may be polysilicon or a like semiconductive trench fill capped by a silicon nitride layer 218b. In addition, the silicon nitride capping layer or oxynitride capping layers taught herein may be replaced with a TEOS layer that is denser than the underlying bulk trench fill TEOS whereby erosion is avoided. Therefore, it is intended that this invention encompass all of the variations and modifications as fall within the scope of the appended claims.

What is claimed is:

1. A method for forming a semiconductor structure, the method comprising the steps of:
   providing a substrate;
   forming a trench region within the substrate, the trench region having a top portion and a bottom portion;
   forming a first liner region within the trench region;
   depositing a first trench fill material within the trench region after forming the first liner region, wherein the first trench fill material comprises silicon and oxygen;
   removing a portion of the first trench fill material to form a first trench plug region within the trench region;
   removing a portion of the first liner region to expose a portion of the substrate;
   depositing a second trench fill material overlying the first trench plug region, wherein the second trench fill material is different from the first trench fill material and the second trench fill material comprises silicon and nitrogen; and
   removing a portion of the second trench fill material to form a second trench plug region, wherein the second trench plug region overlies the first trench plug region and a portion of the second trench plug region contacts the exposed portion of the substrate.

2. The method of claim 1 wherein the step of depositing the second trench fill material comprises:
   depositing a silicon nitride layer.

3. The method of claim 1 wherein the step of depositing the second trench fill material comprises:
   depositing an oxynitride layer.

4. The method of claim 1 wherein the trench region separates a first active area from a second active area, wherein the method further comprises:
   exposing one of the active areas to an active area processing environment wherein this active area processing environment is capable of eroding the first trench plug region over time but is incapable of substantially eroding the second trench plug region that overlies the first first trench plug region, the second trench plug region preventing the first trench plug region from substantial erosion due to the active area processing environment.

5. The method of claim 1 wherein the trench region separates a first active area from a second active area, wherein the method further comprises:
   forming a MOS device in the first active area using first active area processing steps; and
   forming a nonvolatile device within the second active area using second active area processing steps, at least some of which being different from the first active area processing steps.

6. The method of claim 1 wherein the trench region separates a first active area from a second active area, and a second trench region separates the second active area from a third active area, wherein the method further comprises:
   forming a first type of device in the first active area using first active area processing steps;
   forming a second type of device within the second active area using second active area processing steps; and
   forming a third type of device within the third active area using third active area processing steps, wherein the second trench plug region protects the first trench plug region during one or more of the first, second, and third active area processing steps.

7. The method of claim 1 wherein the step of removing the portion of the first trench fill material comprises:
   polishing the first trench fill material; and
   exposing the first trench fill material to an etch process to recess a top surface of the first trench fill material within the trench region to form the first trench plug region.

8. The method of claim 7 wherein the step of removing the portion of the second trench fill material comprises:
   polishing the second trench fill material to form a capping region over the first trench plug region.

9. A method for forming a semiconductor structure, the method comprising the steps of:
   providing a substrate having a top surface;
   forming a pad dielectric over the substrate;
   forming a masking layer over the pad dielectric;
   etching at least one trench region through the masking layer and pad dielectric and into the substrate;
   forming a first liner region within the at least one trench region;
   depositing a first trench fill material, wherein the first trench fill material includes an oxide;
   removing top portions of the first trench fill material to form a first trench plug region made of the first trench fill material;
   etching the first liner region and the first trench plug region to form a recessed trench plug region and to expose a portion of the substrate;
   forming a second liner region adjacent to the exposed portion of the substrate;
   depositing a second trench fill material, wherein the second trench fill material includes a layer selected from a group consisting of a nitride layer and an oxynitride layer;
   removing top portions of the second trench fill material to expose the masking layer; and
   removing the masking layer and the pad dielectric to expose active areas of the semiconductor structure adjacent the at least one trench region.

10. The method of claim 9 wherein the one of either the masking layer or the second trench fill material is silicon nitride.

11. The method of claim 9 wherein the step of removing top portions of the second trench fill material comprises:
   forming a dielectric sidewall spacer around a sidewall of the masking layer, the dielectric sidewall spacer being made of the second trench fill material.

12. The method of claim 9 wherein the first trench fill material mostly comprises silicon dioxide and the second trench fill material mostly comprises silicon nitride.

13. The method of claim 9 wherein the first trench fill material mostly comprises silicon dioxide and the second trench fill material mostly comprises silicon oxynitride.

14. The method of claim 9 wherein the at least one trench region is adjacent a first active area and a second active area, wherein the method further comprises:
   forming a MOS device in the first active area using first active area processing steps; and
   forming a nonvolatile device within the second active area using second active area processing steps, at least some of which being different from the first active area processing steps.

15. The method of claim 9 wherein the at least one trench region is adjacent a first active area, a second active area, and a third active area, wherein the method further comprises:
   forming a first type of device in the first active area using first active area processing steps;
   forming a second type of device within the second active area using second active area processing steps; and
   forming a third type of device within the third active area using third active area processing steps, wherein the second trench fill material protects the first trench fill material during one or more of the first, second, and third active area processing steps.

16. The method of claim 9 wherein the step of forming the first liner region results in oxidation of a top surface of the masking layer.

17. The method of claim 9 wherein the second liner region comprises one of either oxynitride or undoped silicon dioxide.

18. The method of claim 9 wherein the step of removing top portions of the first trench fill material comprises polishing.

19. The method of claim 9 wherein the step of etching the first trench plug region and the first liner region is further characterized as using a dry plasma environment to etch the first trench plug region and the first liner region.

20. The method of claim 9 wherein the step of removing top portions of the second trench fill material comprises polishing.

21. The method of claim 9 wherein the first trench fill material comprises one of either tetraethylorthosilicate (TEOS) or high density plasma (HDP) oxide.

22. The method of claim 9 wherein the first trench fill material is densified after formation by a densification step.

23. The method of claim 9 wherein the masking layer is polysilicon or amorphous silicon.

24. A method for forming a semiconductor structure, the method comprising the steps of:
   providing a substrate;
   forming a trench region within the substrate;
   forming a first liner region within the trench region;
   depositing a first trench fill material within the trench region after forming the first liner region, wherein the first trench fill material comprises silicon and oxygen;
   removing a portion of the first trench fill material to form a first trench plug region within the trench region;
   removing a portion of the first liner region to expose a portion of the substrate;
   forming a second liner region adjacent the exposed portion of the substrate;
   depositing a second trench fill material overlying the first trench plug region, wherein the second trench fill material is different from the first trench fill material and the second trench fill material comprises silicon and nitrogen; and
   removing a portion of the second trench fill material to form a second trench plug region, wherein the second trench plug region overlies the first trench plug region and the second liner region lies between the second trench plug region and the substrate.

25. The method of claim 24 wherein the step of depositing the second trench fill material comprises:
   depositing a silicon nitride layer.

26. The method of claim 24 wherein the step of depositing the second trench fill material comprises:
   depositing an oxynitride layer.

27. The method of claim 24 wherein the trench region separates a first active area from a second active area, wherein the method further comprises:
   exposing one of the active areas to an active area processing environment wherein this active area processing environment is capable of eroding the first trench plug region over time but is incapable of substantially eroding the second trench plug region that overlies the first trench plug region, the second trench plug region preventing the first trench plug region from substantial erosion due to the active area processing environment.

28. The method of claim 24 wherein the trench region separates a first active area from a second active area, wherein the method further comprises:
   forming a MOS device in the first active area using first active area processing steps; and
   forming a nonvolatile device within the second active area using second active area processing steps, at least some of which being different from the first active area processing steps.

29. The method of claim 24 wherein the trench region separates a first active area from a second active area, and a second trench region separates the second active area from a third active area, wherein the method further comprises:
   forming a first type of device in the first active area using first active area processing steps;
   forming a second type of device within the second active area using second active area processing steps; and
   forming a third type of device within the third active area using third active area processing steps, wherein the second trench plug region protects the first trench plug region during one or more of the first, second, and third active area processing steps.

30. The method of claim 24 wherein the step of removing the portion of the first trench fill material comprises:
   polishing the first trench fill material; and
   exposing the first trench fill material to an etch process to recess a top surface of the first trench fill material within the trench region to form the first trench plug region.

31. The method of claim 30 wherein the step of removing the portion of the second trench fill material comprises:
   polishing the second trench fill material to form a capping region over the first trench plug region.

* * * * *